(12) United States Patent
Hsu et al.

(10) Patent No.: US 11,393,746 B2
(45) Date of Patent: Jul. 19, 2022

(54) REINFORCING PACKAGE USING REINFORCING PATCHES

(71) Applicant: Taiwan Semiconductor Manufacturing Company, Ltd., Hsinchu (TW)

(72) Inventors: Chia-Kuei Hsu, Hsinchu (TW); Ming-Chih Yew, Hsinchu (TW); Po-Yao Lin, Zhudong Township (TW); Shuo-Mao Chen, New Taipei (TW); Feng-Cheng Hsu, New Taipei (TW); Shin-Puu Jeng, Po-Shan Village (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/823,995

(22) Filed: Mar. 19, 2020

(65) Prior Publication Data

US 2021/0296220 A1 Sep. 23, 2021

(51) Int. Cl.
| | |
|---|---|
| *H01L 23/498* | (2006.01) |
| *H01L 21/48* | (2006.01) |
| *H01L 21/56* | (2006.01) |
| *H01L 23/00* | (2006.01) |
| *H01L 25/065* | (2006.01) |
| *H01L 25/18* | (2006.01) |

(52) U.S. Cl.
CPC .... *H01L 23/49822* (2013.01); *H01L 21/4857* (2013.01); *H01L 21/563* (2013.01); *H01L 23/49838* (2013.01); *H01L 24/81* (2013.01); *H01L 25/0655* (2013.01); *H01L 25/18* (2013.01); *H01L 2224/81815* (2013.01)

(58) Field of Classification Search
CPC ........... H01L 23/49822; H01L 21/4857; H01L 21/563; H01L 23/49838; H01L 24/81
See application file for complete search history.

(56) References Cited

U.S. PATENT DOCUMENTS

| | | |
|---|---|---|
| 7,193,328 B2 | 3/2007 | Suzuki et al. |
| 8,361,842 B2 | 1/2013 | Yu et al. |
| 8,609,998 B2 | 12/2013 | Miyasaka et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |

(Continued)

FOREIGN PATENT DOCUMENTS

| | | |
|---|---|---|
| JP | 20030005022 A | 1/2003 |
| JP | 2010165855 A | 7/2010 |

(Continued)

*Primary Examiner* — Nicholas J Tobergte
(74) *Attorney, Agent, or Firm* — Slater Matsil, LLP

(57) ABSTRACT

A method includes forming a redistribution structure, which formation process includes forming a plurality of dielectric layers over a carrier, forming a plurality of redistribution lines extending into the plurality of dielectric layers, and forming a reinforcing patch over the carrier. The method further includes bonding a package component to the redistribution structure, with the package component having a peripheral region overlapping a portion of the reinforcing patch. And de-bonding the redistribution structure and the first package component from the carrier.

20 Claims, 24 Drawing Sheets

(56) References Cited

U.S. PATENT DOCUMENTS

| | | |
|---|---|---|
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,209,048 B2 | 12/2015 | Huang et al. |
| 10,340,238 B2 | 7/2019 | Furuichi |
| 10,892,290 B2* | 1/2021 | Qian .................. H01L 24/03 |
| 11,101,209 B2 | 8/2021 | Liu et al. |
| 2009/0218703 A1* | 9/2009 | Park .................. H01L 23/3114 257/783 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0221493 A1* | 8/2013 | Kim .................. H01L 23/3128 257/620 |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0189980 A1* | 6/2016 | Paek .................. H01L 23/145 438/126 |
| 2018/0025997 A1 | 1/2018 | Lai et al. |
| 2018/0044169 A1 | 2/2018 | Hatcher, Jr. et al. |
| 2018/0114734 A1* | 4/2018 | Wang .................. H01L 21/4853 |
| 2019/0292415 A1 | 9/2019 | Sato et al. |
| 2019/0371734 A1 | 12/2019 | Chang et al. |
| 2020/0035655 A1 | 1/2020 | Ting et al. |
| 2021/0159188 A1* | 5/2021 | Fang .................. H01L 21/56 |
| 2021/0225787 A1* | 7/2021 | Wu .................. H01L 24/02 |

FOREIGN PATENT DOCUMENTS

| | | |
|---|---|---|
| JP | 2019041041 A | 3/2019 |
| KR | 20190038357 A | 4/2019 |
| TW | 201608653 A | 3/2016 |
| TW | 201826421 A | 7/2018 |

* cited by examiner

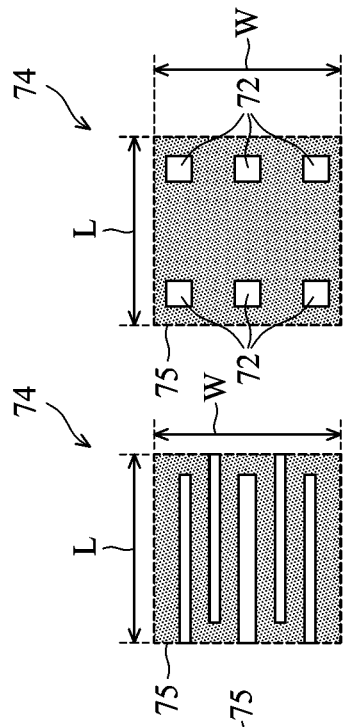
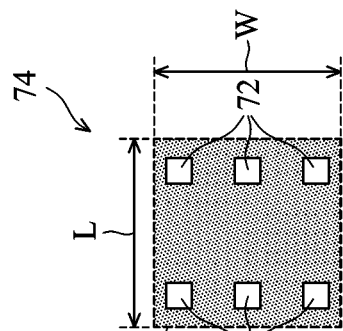
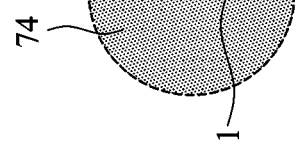
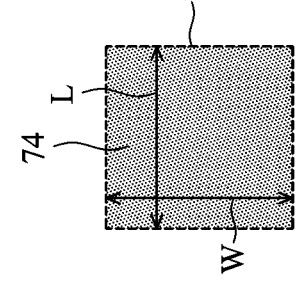
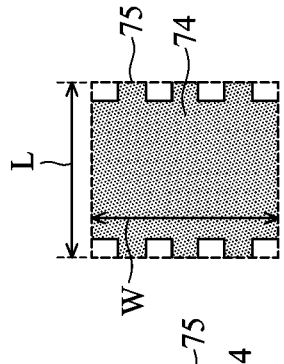
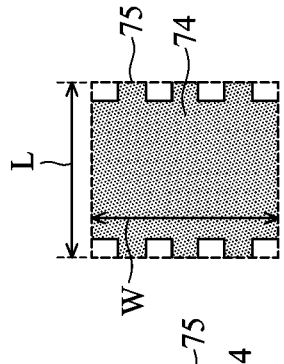
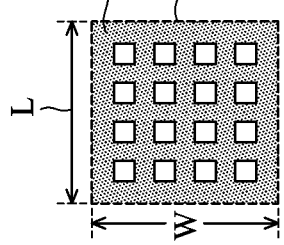
FIG. 16A  FIG. 16B  FIG. 16C  FIG. 16D
FIG. 16E  FIG. 16F  FIG. 16G

REINFORCING PACKAGE USING REINFORCING PATCHES

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

In conventional package technologies, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies. In the packaging, a plurality of dielectric layers and a plurality of redistribution lines are formed. The redistribution lines are electrically connected to the dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 16A, 16B, 16C, 16D, 16E, 16F, and 16G illustrate the patterns of example reinforcing patches in accordance with some embodiments.

DETAILED DESCRIPTION

Figure 1:
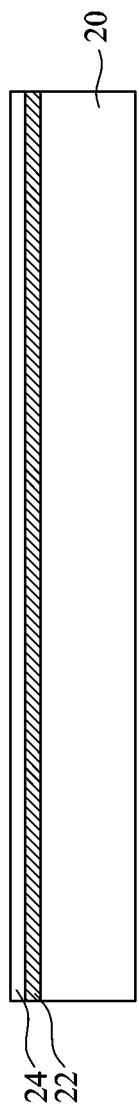
FIGS. 1 through 14 illustrate the cross-sectional views of intermediate stages in the formation of a package including reinforcing patches in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including reinforcing patches and the method of forming the same are provided in accordance with some embodiments. In accordance with some embodiments of the present disclosure, the reinforcing patches are formed of metal, and have a high density. The reinforcing patches are in the regions suffering from high stress such as in the regions directly underlying the peripherals of the dies in the packages. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 14 illustrate the cross-sectional views of intermediate stages in the formation of a package in accordance with some embodiments of the present disclosure. The corresponding processes are also reflected schematically in the process flow shown in FIG. 23.

FIG. 1 illustrates carrier 20 and release film 22 formed on carrier 20. Carrier 20 may be a glass carrier in accordance with some embodiments. Carrier 20 may have a round top-view shape. Release film 22 may be formed of a Light-To-Heat-Conversion (LTHC) material, which may be decomposed, so that the overlying structures that will be formed in subsequent steps can be released from carrier 20. In accordance with some embodiments of the present disclosure, release film 22 is formed of an epoxy-based thermal-release material. Release film 22 may be coated onto carrier 20. The top surface of release film 22 is leveled and planar.

Figure 23:
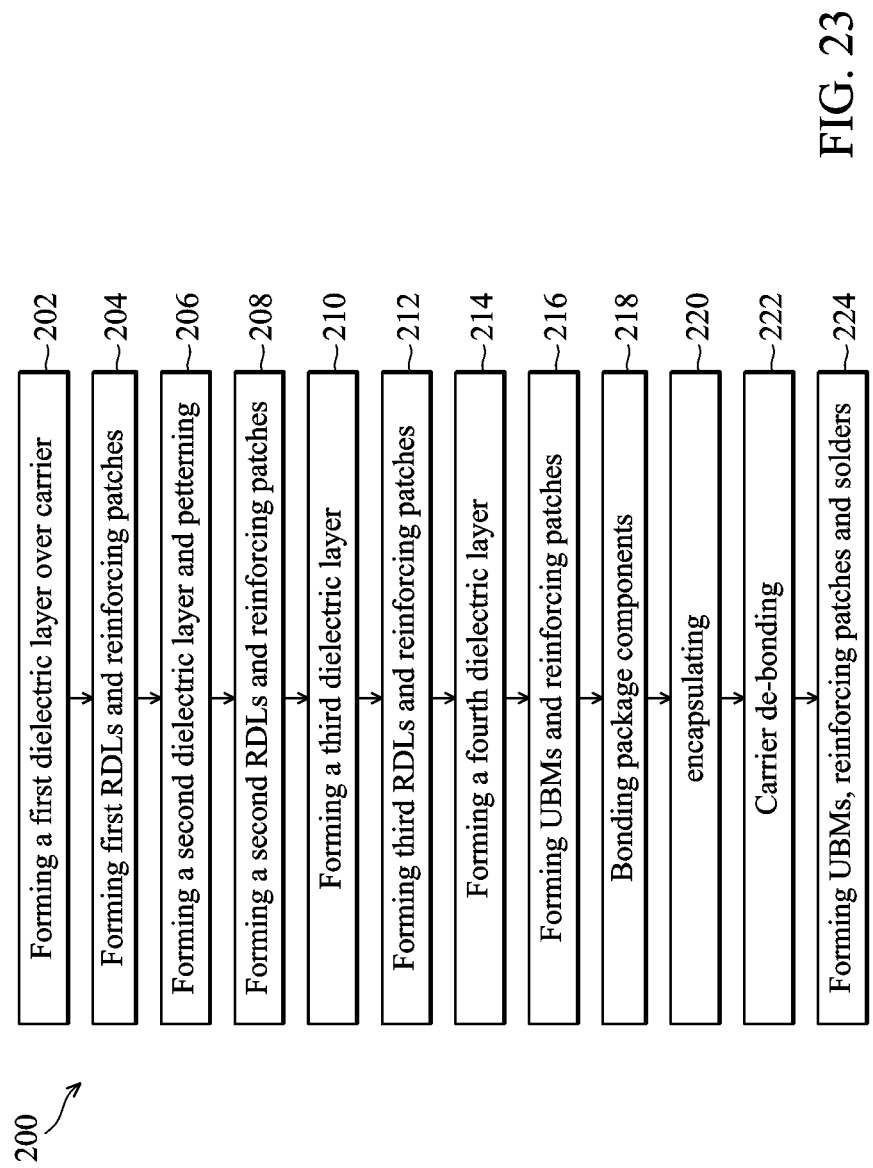
FIG. 23 illustrates a process flow for forming a package in accordance with some embodiments.

Dielectric layer 24 is formed on release film 22. The respective process is illustrated as process 202 in the process flow 200 as shown in FIG. 23. In accordance with some embodiments of the present disclosure, dielectric layer 24 is formed of a polymer, which may be formed of or comprise polyimide, Polybenzoxazole (PBO), benzocyclobutene (BCB), or the like. Dielectric layer 24 may also be formed of or comprise a non-polymer (inorganic material), which may be silicon oxide, silicon nitride, silicon oxynitride, or the like.

Figure 2:
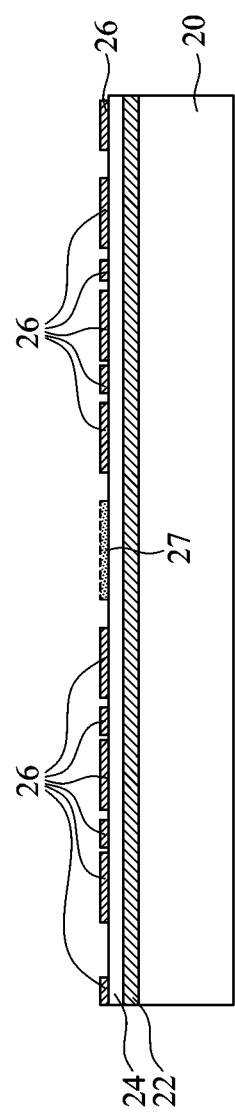

Referring to FIG. 2, Redistribution Lines (RDLs) 26 (and possibly reinforcing patches 27) are formed over dielectric layer 24. The respective process is illustrated as process 204 in the process flow 200 as shown in FIG. 23. The formation of RDLs 26 may include forming a seed layer (not shown) over dielectric layer 24, forming a patterned mask (not shown) such as a photo resist over the seed layer, and then performing a metal plating process on the exposed seed layer to plate a metallic material. The patterned mask and the portions of the seed layer covered by the patterned mask are then removed, leaving RDLs 26 as in FIG. 2. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro chemical plating. The plated metallic material may include a metal or a metal alloy including copper, aluminum, tungsten, or the like. RDLs 26 may include metal pads for landing Under-bump Metallurgies (UBMs), and metal traces for routing electrical signals, power, or the like.

In accordance with some embodiments, at the same time RDLs 26 are formed, reinforcing patches 27 are formed using the same processes for forming RDLs 26. The details of reinforcing patches 27 are discussed in subsequent paragraphs. In accordance with alternative embodiments, reinforcing patches 27 are not formed.

Figure 3:
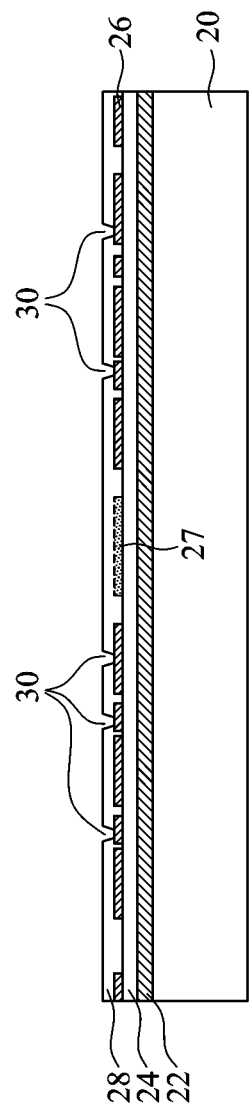

Referring to FIG. 3, dielectric layer 28 is formed on RDLs 26. The respective process is illustrated as process 206 in the process flow 200 as shown in FIG. 23. The bottom surface of dielectric layer 28 is in contact with the top surfaces of RDLs 26, reinforcing patches 27, and dielectric layer 24. In accordance with some embodiments of the present disclosure, dielectric layer 28 is formed of a polymer, which may be polyimide, PBO, BCB, or the like. In accordance with alternative embodiments of the present disclosure, dielectric layer 28 is formed of a non-polymer (inorganic) material, which may include silicon oxide, silicon nitride, or the like. Dielectric layer 28 is then patterned to form openings 30 therein. Hence, some portions of RDLs 26 are exposed through the openings 30 in dielectric layer 28.

Figure 4:
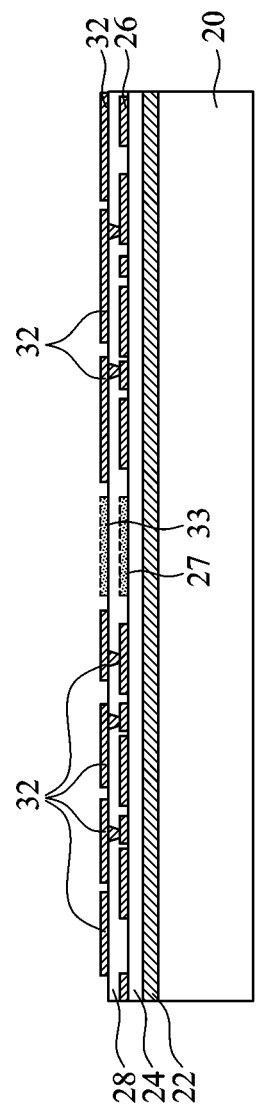

Next, referring to FIG. 4, RDLs 32 (and possibly reinforcing patches 33) are formed to connect to RDLs 26. The respective process is illustrated as process 208 in the process flow 200 as shown in FIG. 23. RDLs 32 include metal traces (metal lines) over dielectric layer 28. RDLs 32 also include vias extending into the openings 30 in dielectric layer 28. RDLs 32 are also formed in a plating process, wherein each of RDLs 32 includes a seed layer (not shown) and a plated metallic material over the seed layer. The materials of the seed layer and the plated metallic material may be selected from the same candidate materials of the seed layer and the plated metallic material, respectively, in RDLs 26.

In accordance with some embodiments, at the same time RDLs 32 are formed, reinforcing patches 33 are formed in the same process for forming RDLs 32. The details of reinforcing patches 33 are discussed in subsequent paragraphs. In accordance with alternative embodiments, reinforcing patches 33 are not formed.

Figure 5:
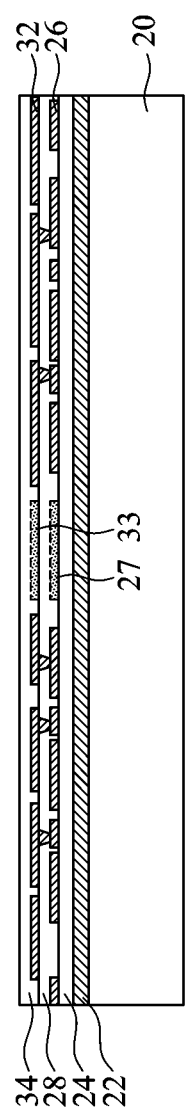

Referring to FIG. 5, dielectric layer 34 is formed over RDLs 32 and dielectric layer 28. The respective process is illustrated as process 210 in the process flow 200 as shown in FIG. 23. In accordance with some embodiments of the present disclosure, dielectric layer 34 is formed of a polymer, which may be polyimide, PBO, BCB, or the like. In accordance with alternative embodiments of the present disclosure, dielectric layer 34 may be formed of an inorganic material, which may be selected from silicon oxide, silicon nitride, silicon carbo-nitride, silicon oxynitride, or the like.

Figure 6:
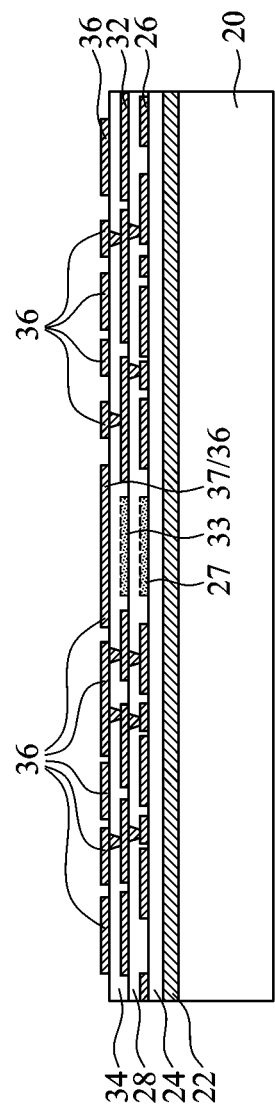

FIG. 6 illustrates the formation of RDLs 36 (which are electrically connected to RDLs 32) and the corresponding reinforcing patches 37. The respective process is illustrated as process 212 in the process flow 200 as shown in FIG. 23. The formation of RDLs 36 may adopt the methods and materials similar to those for forming RDLs 32. It is appreciated that although in the illustrative example embodiments, three dielectric layers 24, 28 and 34 and the respective RDLs 26, 32, and 36 formed therein are discussed, fewer or more dielectric layers and RDL layers may be adopted, depending on the routing requirement and the requirement of using polymers for buffering stress. For example, there may be two dielectric layers or four, five or more dielectric layers and the corresponding RDL layers.

In accordance with some embodiments, at the same time RDLs 36 are formed, reinforcing patches 37 are formed in the same process for forming RDLs 32. In accordance with alternative embodiments, reinforcing patches 37 are not formed. The details of reinforcing patches 37 are discussed in subsequent paragraphs. One of the features is illustrated as 36/37 to indicate that it may be used for either one, or both, of electrical routing and mechanical reinforcing. For example, RDL/reinforcing patch 36/37 may be used for routing but not for reinforcing, used for reinforcing but not for routing, or used for both routing and reinforcing, as will be discussed in subsequent paragraphs.

Figure 7:
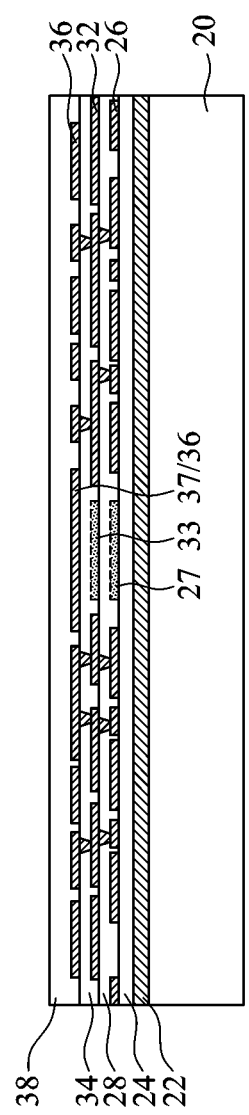

Referring to FIG. 7, dielectric layer 38 is formed over RDLs 36 and dielectric layer 34. The respective process is illustrated as process 214 in the process flow 200 as shown in FIG. 23. In accordance with some embodiments of the present disclosure, dielectric layer 38 is formed of a polymer, which may be polyimide, PBO, BCB, or the like. In accordance with alternative embodiments of the present disclosure, dielectric layer 38 is formed of an inorganic material, which may be selected from silicon oxide, silicon nitride, silicon carbo-nitride, silicon oxynitride, or the like.

Figure 8:
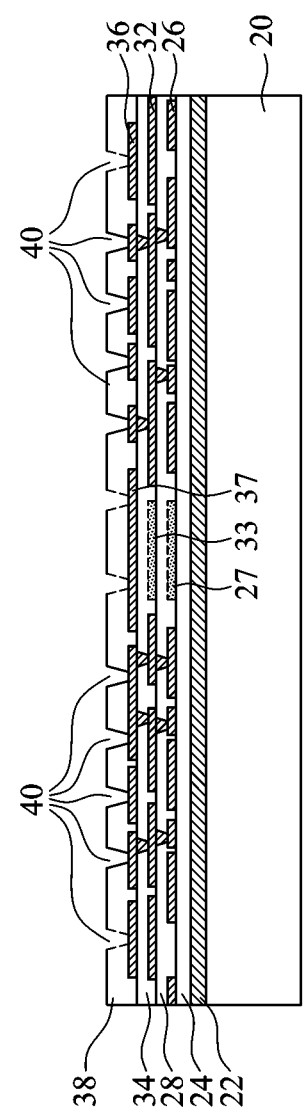

Referring to FIG. 8, openings 40 are formed in dielectric layer 38 to reveal the underlying RDLs 36. Reinforcing patch 37 (if formed) may be, or may not be, revealed. In accordance with some embodiments of the present disclosure, dielectric layer 38 is formed of a light-sensitive material such as polyimide or PBO. Accordingly, the formation of openings 40 may include performing a light-exposure process on dielectric layer 38 using a lithography mask, which includes opaque and transparent patterns. The dielectric layer 38 is then developed to form openings 40.

Figure 9:
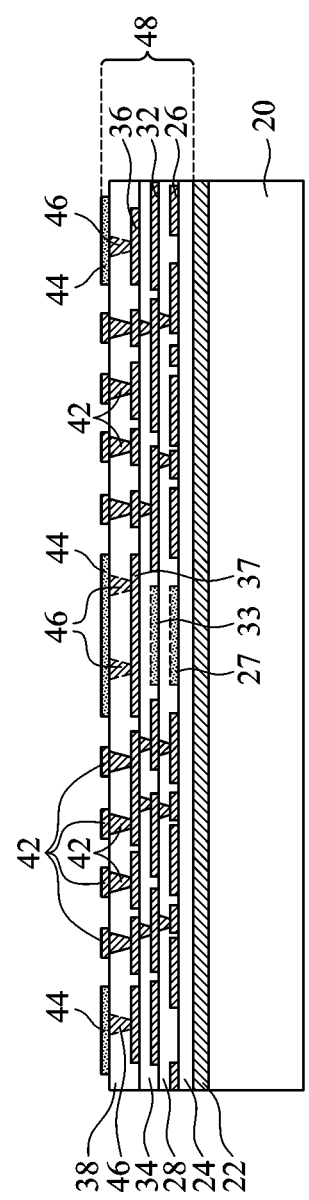

Referring to FIG. 9, UBMs 42 and reinforcing patches 44 are formed. UBMs 42 may also have routing function, and hence are also referenced to as RDLs 42. The respective process is illustrated as process 216 in the process flow 200 as shown in FIG. 23. The formation process of UBMs 42 and reinforcing patches 44 may include forming a blanket metal seed layer (not shown separately) on dielectric layer 38, forming a patterned mask (not shown) such as a photo resist over the metal seed layer, and then performing a metal plating process on the exposed metal seed layer. The patterned mask and the portions of the metal seed layer covered by the patterned mask are then removed, leaving UBMs 42 and reinforcing patches 44. In accordance with some embodiments of the present disclosure, the metal seed layer includes a titanium layer and a copper layer over the titanium layer, wherein the titanium seed layer and the copper seed layers are formed as conformal layers comprising first portions extending into openings 40, and second portions over dielectric layer 38. The metal seed layer may be formed using, for example, PVD. The plating may be performed using, for example, electro chemical plating. Since UBMs 42 and reinforcing patches 44 may be formed in common processes, UBMs 42 and reinforcing patches 44 may have the same structure and formed of the same materials. In accordance with alternative embodiments, UBMs 42 and reinforcing patches 44 may be formed in separate processes, and hence may be formed of different materials or the same materials selected from titanium, copper, nickel, palladium, or the like.

In accordance with some embodiments, all of reinforcing patches 44 are over dielectric layer 38, and there is no via in dielectric layer 38 connecting reinforcing patches 44 to the underlying conductive features in dielectric layer 38. In accordance with alternative embodiments of the present disclosure, some or all of reinforcing patches 44 are electrically and physically connected to the underlying RDLs 36 and/or reinforcing patches 37 through vias 46. Vias 46 are thus shown as dashed to indicate that vias 46 may or may not be formed. Reinforcing patches 44 and vias 46 (if formed) are formed in common formation processes. Throughout the description, the features over release film 22, which include RDLs, reinforcing patches, and dielectric layers, are collectively referred to as redistribution structure 48.

Figure 10:
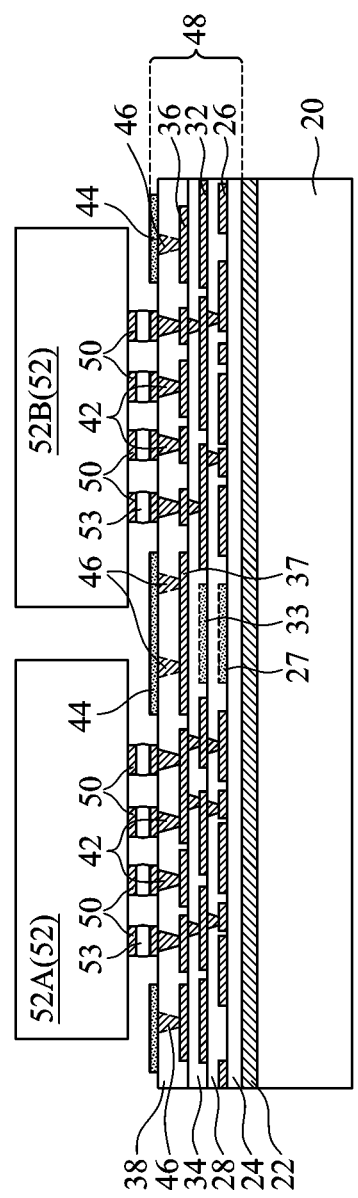

Next, package components 52A and 52B are bonded to redistribution structure 48, as shown in FIG. 10. The respective process is illustrated as process 218 in the process flow 200 as shown in FIG. 23. In accordance with some embodiments of the present disclosure, package components 52A and 52B include a logic die(s), a memory die(s), an input-output (IO) die(s), a die stack(s), a package(s), or the like in any combination. It is also appreciated that although two package components are illustrated, there may be a plurality of groups of package components, with each group including one, three, four, five, or more package components bonded to redistribution structure 48. In accordance with some embodiments, the logic die may be a Central Processing Unit (CPU) die, a Micro Control Unit (MCU) die, a BaseBand (BB) die, an Application processor (AP) die, or the like. The memory die(s) may include Dynamic Random Access Memory (DRAM) die(s), Static Random Access Memory (SRAM) die(s), or the like. The die stack(s) may include memory die stack(s), which may be High-Bandwidth Memory (HBM) stack(s). Package components 52A and 52B may be the same as each other or different from each other. Package components 52A and 52B are also collectively referred to as package components 52.

The bonding of package components 52A and 52B may be through solder bonding, with solder regions 53 joining UBMs 42 to metal pads (or micro bumps) 50 in package components 52A and 52B. In accordance with alternative embodiments, other types of bonding methods such as hybrid bonding, direct metal-to-metal bonding, or the like, may be used.

Figure 11:
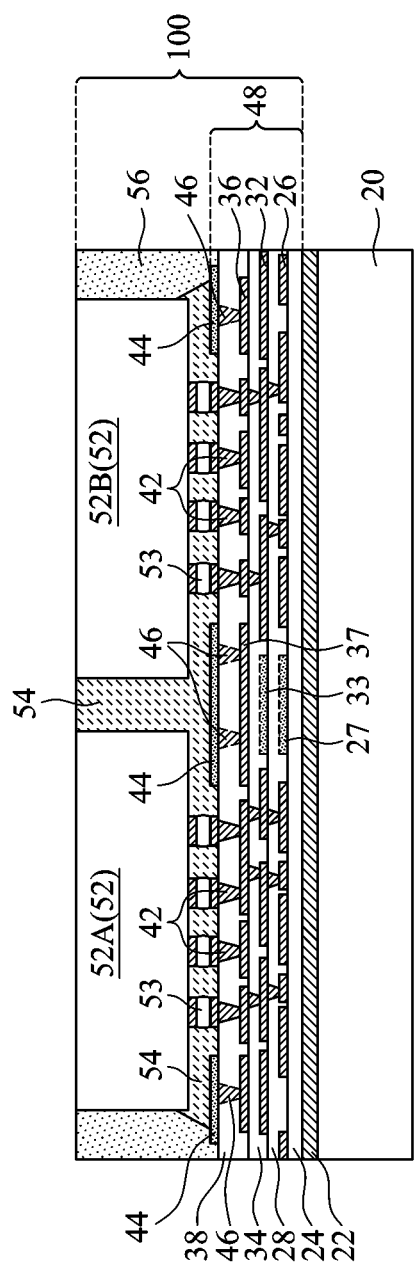

FIG. 11 illustrates that underfill 54 and encapsulant 56 are dispensed for encapsulation. The respective process is illustrated as process 220 in the process flow 200 as shown in FIG. 23. In accordance with some embodiments, underfill 54 is first dispensed into the gaps between package components 52 and redistribution structure 48. Underfill 54 may or may not be dispensed between neighboring package components 52. Encapsulant 56 may be formed of or comprise a molding compound, a molding underfill, an epoxy, a resin, or the like. Underfill 54 and encapsulant 56 are dispensed in flowable forms, and are then cured. When formed of molding compound, encapsulant 56 may include a base material, which may be a polymer, a resin, an epoxy, or the like, and filler particles in the base material. The filler particles may be dielectric particles of $SiO_2$, $Al_2O_3$, silica, or the like, and may have spherical shapes. Also, the spherical filler particles may have a plurality of different diameters. A planarization process such as a Chemical Mechanical Polish (CMP) process or a mechanical grinding process may be performed to level the top surfaces of package components 52 with the top surface of encapsulant 56. Throughout the description, the features over release film 22, which include redistribution structure 48, package components 52, underfill 54, and encapsulant 56 are collectively referred to as reconstructed wafer 100.

Next, reconstructed wafer 100 is de-bonded from carrier 20. The respective process is illustrated as process 222 in the process flow 200 as shown in FIG. 23. In accordance with some embodiments, a laser beam is scanned through carrier 20 to project on release film 22. Release film 22 absorbs the energy of the laser beam and is decomposed. Carrier 20 may thus be lifted off from release film 22, and hence reconstructed wafer 100 is de-bonded (demounted) from carrier 20. The resulting reconstructed wafer 100 is shown in FIG. 12, and is shown upside down as compared to FIG. 11.

Figure 12:
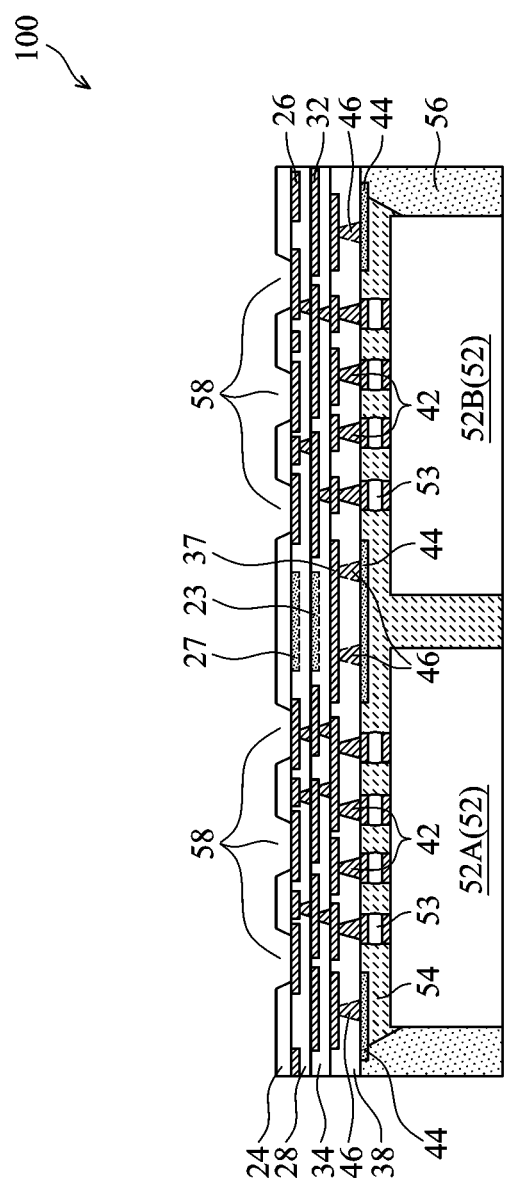

Further referring to FIG. 12, openings 58 are formed in dielectric layer 24. In accordance with some embodiments of the present disclosure, the formation of openings 58 includes a laser drill process, an etching process, or the like. The metal pads in RDLs 26 are exposed to openings 58.

Figure 13:
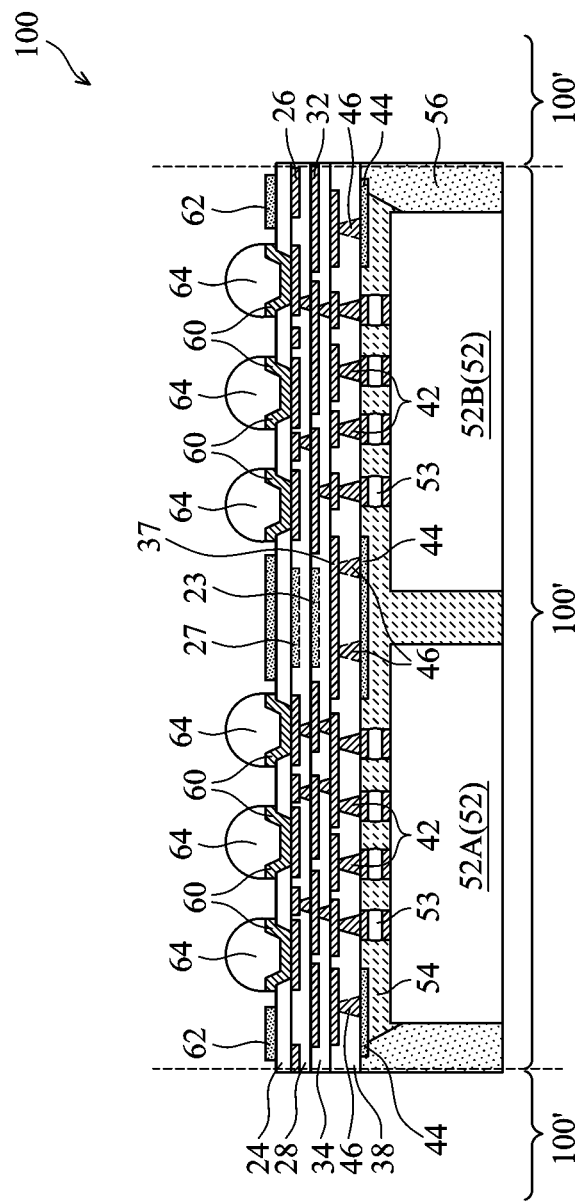

Referring to FIG. 13, UBMs 60 and reinforcing patches 62 are formed. The respective process is illustrated as process 224 in the process flow 200 as shown in FIG. 23. The formation process of UBMs 60 and reinforcing patches 62 may include forming a metal seed layer (not shown) over dielectric layer 24, forming a patterned mask (not shown) such as a photo resist over the metal seed layer, and then performing a metal plating process on the exposed seed layer. The patterned mask and the portions of the metal seed layer covered by the patterned mask are then removed, leaving UBMs 60 and reinforcing patches 62. In accordance with some embodiments of the present disclosure, the metal seed layer includes a titanium layer and a copper layer over the titanium layer, wherein the titanium seed layer is formed as a conformal layer comprising first portions extending into openings 58, and second portions over dielectric layer 24. The metal seed layer may be formed using, for example, PVD. The plating may be performed using, for example, electro chemical plating. Since UBMs 60 and reinforcing patches 62 may be formed in common processes, UBMs 60 and reinforcing patches 62 may have the same structure and formed of the same materials. In accordance with alternative embodiments, UBMs 60 and reinforcing patches 62 may be formed in separate processes, and hence may be formed of different materials or the same materials.

Solder regions 64 are then formed on UBMs 60. The respective process is also illustrated as process 224 in the process flow 200 as shown in FIG. 23. In accordance with some embodiments, the formation of solder regions 64 may include placing solder balls on UBMs 60, and then reflowing the placed solder balls. In accordance with alternative embodiments, the formation process of solder regions 64 may include plating solder regions on UBMs 60, and then reflowing the plated solder regions. A singulation process may then be performed to saw the reconstructed wafer 100 as a plurality of packages 100', which are identical to each other.

Figure 14:
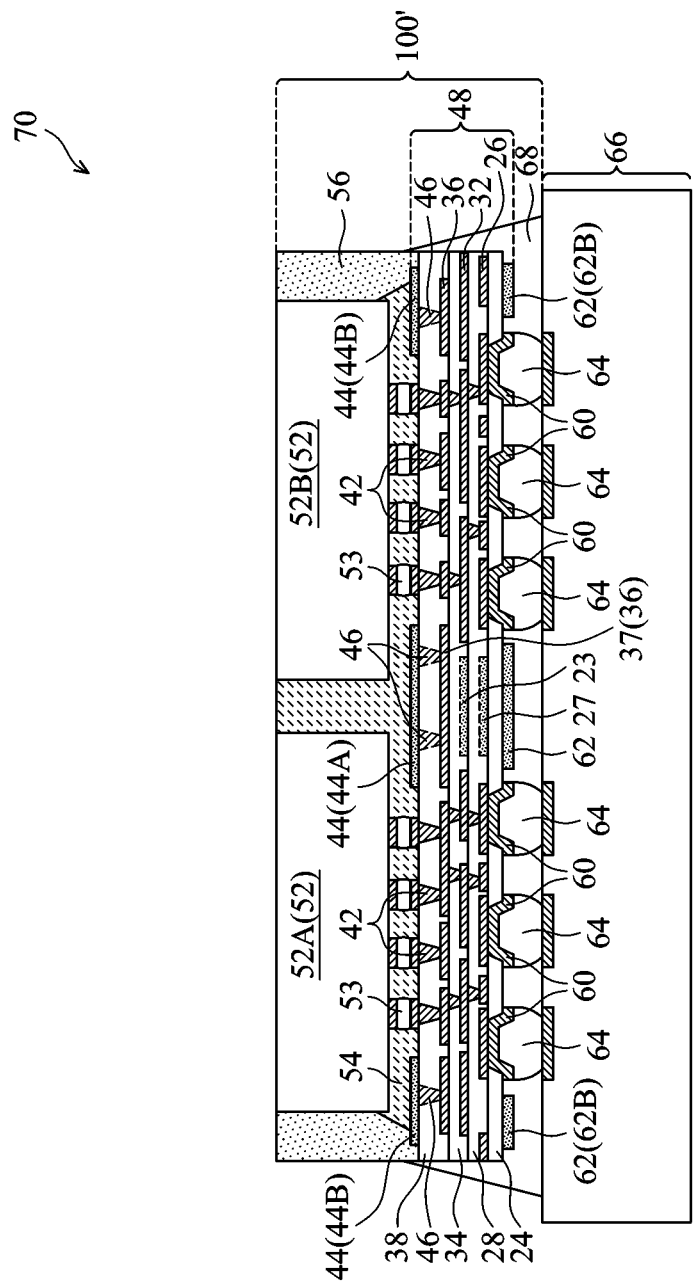

FIG. 14 illustrates the bonding of packages 100' to package component 66, so that package 70 is formed. In accordance with some embodiments of the present disclosure, package component 66 is or comprises a package substrate, an interposer, a package, or the like. Underfill 68 may be dispensed into the gap between package 100' and package component 66. Accordingly, reinforcing patches 62 may be in contact with underfill 68.

FIGS. 16A, 16B, 16C, 16D, 16E, 16F, and 16G illustrate the plane views of some example reinforcing patches 27, 33, 37, 44, and 62. In subsequent paragraphs, reinforcing patches 27, 33, 37, 44, and 62 singularly or collectively are represented as reinforcing patches 74. Accordingly, the illustrated reinforcing patches are marked as 74 to indicate any of reinforcing patches 27, 33, 37, 44, and 62 may adopt these patterns. FIG. 16A illustrates a rectangular reinforcing patch 74, which is solid and does not have through-holes therein. FIG. 16B illustrates a circular reinforcing patch, which is solid and does not have through-holes therein. FIG. 16C illustrates a reinforcing patch 74 formed of serpentine lines. FIG. 16D illustrates a rectangular reinforcing patch having through-holes 72 therein. FIG. 16E illustrates a reinforcing patch formed of a mesh, which includes horizontal lines and vertical lines crossing the horizontal lines. The mesh may also be viewed as a metal plate having a plurality of through-holes therein, with the through-holes forming an array. FIG. 16F illustrates an oval reinforcing patch, which is solid and does not have through-holes therein. FIG. 16G illustrates a reinforcing patch with an irregular shape. It is appreciated that the illustrated reinforcing patches are examples, and more reinforcing patches may be formed by combining the features in these example, as long as these features are applicable. For example, the through-holes 72 (FIG. 16D) may be formed in any of the reinforcing patches 74 shown in FIGS. 16B, 16F, and 16G, or the like. Also, the reinforcing patch with the mash pattern may also have the outer contour 75 shown in FIGS. 16B, 16F, and 16G.

In order to keep reinforcing patches 74 to have enough strength to reinforce the structure, reinforcing patches 74 are designed to have enough size. For example, the lengths L and width W in FIGS. 16A, 16C, 16D 16E, 16F, and 16G, and diameter D1 in FIG. 16B, may be greater than about 500 μm, and may be in the range between about 500 μm and about 10,000 μm. Furthermore, in the region defined by the contours 75, which are shown with dashed lines, the overall density of metal is high enough, wherein the metal density is the ratio of the total area of metal in contour 75 to the total area within contour 75. For example, the metal density may be greater than about 70 percent, and may be between about 70 percent and 100 percent (when the reinforcing patch is solid). Otherwise, if the reinforcing patches 74 are too thin and/or the metal density is too low, under the stress, the reinforcing patches 74 will easily deform, and does not have enough strength to reinforce the package.

Referring back to FIG. 14, reinforcing patches 27, 33, 37, 44, and 62 are used to reinforce package 100'. For example, package components 52 are bonded to RDL structure 48, and there is a significant difference between the Coefficient of Thermal Expansion (CTE) of package components 52 and the CTE of RDL structure 48. This results in significant stress to be generated in the regions close to the peripheral regions of package components 52, and in the regions close to the gaps between neighboring package components 52. For example, in an example shown in FIG. 14, there are some reinforcing patches 27, 33, 37, 44A, and 62A directly underlying the gap between package components 52A and 52B. These reinforcing patches may also extend directly underlying the peripheral regions of package components 52A and/or 52B. Also, there are some reinforcing patches (such as 44B and 62B) directly underlying the outer peripheral regions of package components 52A and/or 52B.

Figure 17:
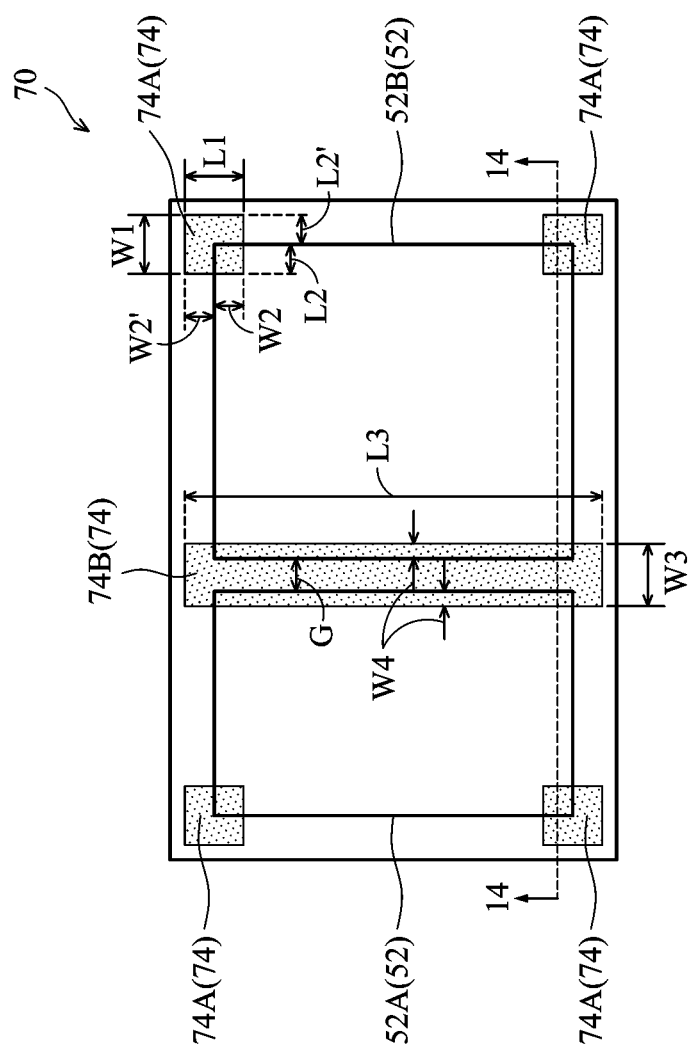
FIGS. 17 through 19 illustrate the layouts of some reinforcing patches in accordance with some embodiments.
Figure 18:
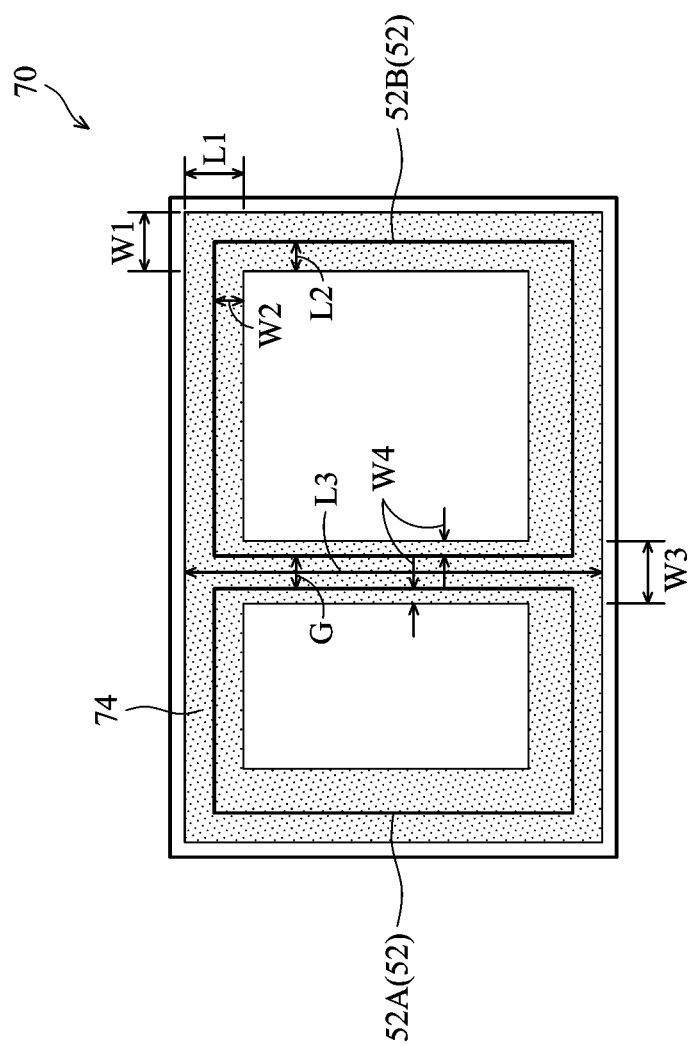
Figure 19:
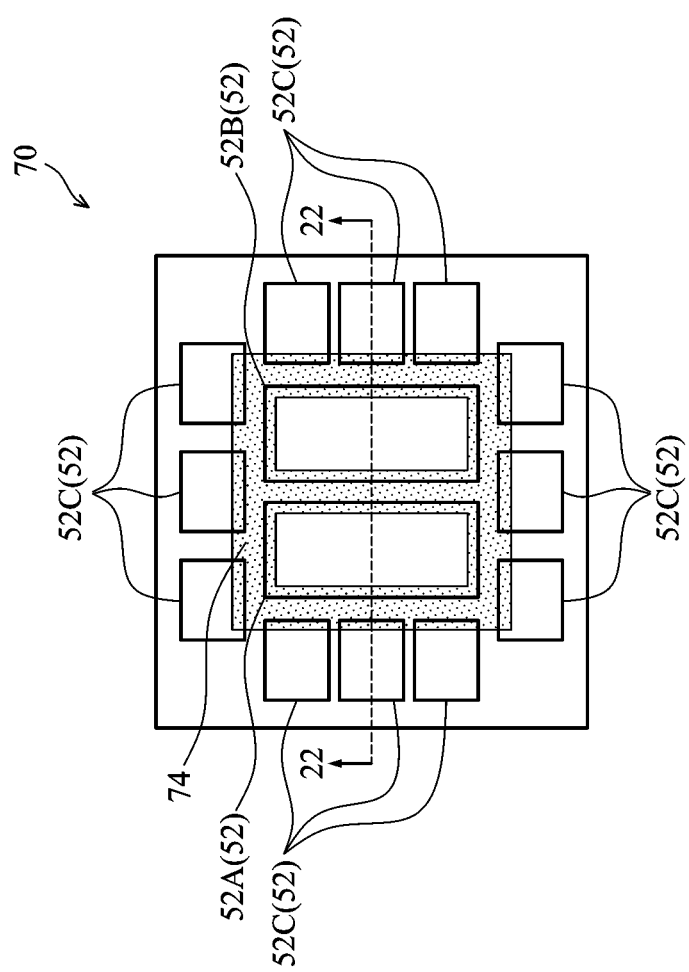

FIGS. 17 through 19 illustrate the plane views of some of reinforcing patches 74 (which includes reinforcing patches 74A, 74B, and 74C), and any of reinforcing patches 74 may represent any of reinforcing patches 27, 33, 37, 44, and 62 in any combination. As shown in FIG. 17, reinforcing patches 74A are disposed at the corners of (and underlying) package components 52A and 52B. In order to have enough reinforce ability, the length L1 and width W1 of reinforcing patches 74A may be greater than about 500 μm, and may be in the range between about 500 μm and about 10,000 μm. Furthermore, package components 52A and 52B overlap reinforcing patches 74 for adequate areas. For example, the overlap length L2 and overlap width W2 may be greater than about 200 μm. The non-overlap length L2' and non-overlap width W2' may also be greater than about 200 μm, so that reinforcing patches 74 may expand far enough to provide reinforcing force to the nearby regions where the stress is highest.

Reinforcing patch 74B is disposed close to the gap between package components 52A and 52B. In accordance with some embodiments, reinforcing patch 74B expands throughout the entire area directly underlying the gap between package components 52A and 52B, and may extend directly underlying one or both of package components 52A and 52B. Accordingly, the width W3 of reinforcing patch 74 is greater than the gap G between package components 52A and 52B. Furthermore, the overlap width W4 of reinforcing patch 74 may be greater than about 200 μm, and may be in the range between about 200 μm and about 500 μm. Length L3 of reinforcing patch 74 may be greater than the lengths of components 52A and 52B. The reference cross-section shown in FIG. 14 may be obtained from the reference cross-section 14-14 shown in FIG. 17.

FIG. 18 illustrates a plane view of reinforcing patch 74 in accordance with other embodiments. The reinforcing patch 74 may form a ring or a plurality of ring around the peripheral regions of each of package components 52A and 52B. When there is more than one package component 52, the neighboring reinforcing patch rings may join with each other, so that the joining region may span across the entire gap(s) between the neighboring package components 52. Furthermore, each of the reinforcing patch ring may include an inner portion directly underlying the peripheral region of the corresponding package component 52, and an outer portion not overlapped by the corresponding package component 52. The outer portion thus may also be a ring encircling the corresponding package component 52 in the plane. The overlapping width W4, which is also the width of the inner portions of the reinforcing patch rings, may be greater than about 200 μm in accordance with some embodiments.

FIG. 19 illustrates a plane view of package 70 including reinforcing patch 74 in accordance with other embodiments. Package 70 includes some outer smaller package components 52C aligned to a ring encircling the larger package components 52A and 52B. High stress is more like to occur around the peripheral regions of larger package components 52A and 52B, and is less likely to occur around the outer peripheral regions of the smaller package components 52C. Accordingly, reinforcing patch(es) 74 may be formed close to the peripheral regions of the larger package components 52A and 52B, and may, or may not, be formed close to the outer peripheral regions of the smaller package components 52C. For example, as shown in FIG. 19, the reinforcing patches 74 are formed around, and may extend underlying, package components 52A and 52B. Reinforcing patches 74 may, or may not, extend directly underlying the smaller package components 52C.

Referring again back to FIG. 14, reinforcing patches 27, 33, 37, 44, and 62 may be electrically floating. In accordance with some embodiments, each of the reinforcing patches 27, 33, 37, 44, and 62 may be formed as a discrete and isolated feature, with no vias joined to the reinforcing patches. Accordingly, each of the corresponding reinforcing patches 27, 33, 37, 44, and 62 is fully enclosed in dielectric materials. In accordance with alternative embodiments, some neighboring reinforcing patches may be joined with (through vias) the overlying and/or underlying reinforcing patches to form a joined structure, so that the reinforcing ability is further improved. The joined structure may still be electrically floating, and may be fully enclosed in dielectric materials. For example, as shown in FIG. 14, when vias 46 are formed, reinforcing patches 44A and 44B may form a joined structure with the respective underlying reinforcing patches 37. In accordance with alternative embodiments, reinforcing patches 27, 33, 37, 44, and 62 are connected to electrical ground, and may have electrical shielding function. In accordance with alternative embodiments, reinforcing patches 27, 33, 37, 44, and 62 are connected to positive power supply voltage Vdd.

Figure 15A:
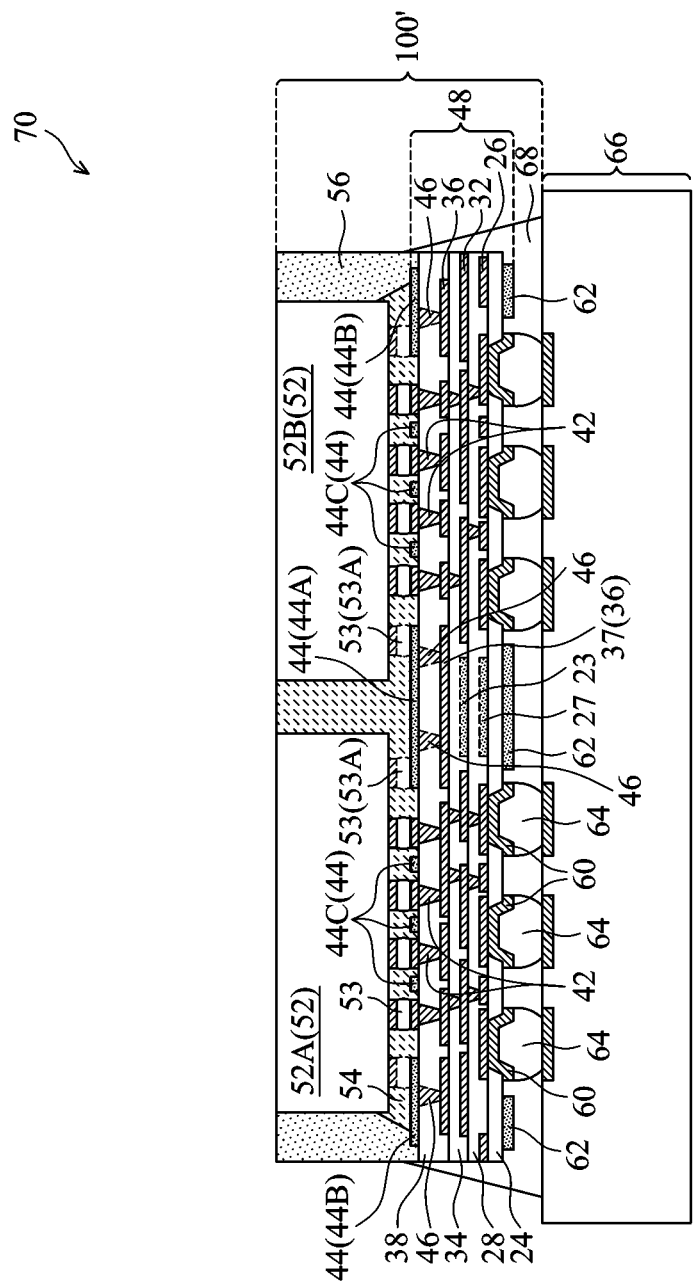
FIGS. 15A and 15B illustrate a cross-sectional view and a plane view, respectively, of a package with a reinforcing patch having electrical function in accordance with some embodiments.

FIG. 15A illustrates package 70 in accordance with alternative embodiments. These embodiments are similar to the embodiments shown in FIG. 14, except that the reinforcing patches 27, 33, 37, 44, and/or 62, besides the mechanical reinforcing function, may also have electrical function. For example, reinforcing patch 44A may interconnect package components 52A and 52B through solder regions 53A. In these embodiments, reinforcing patch 44A also acts as the UBM for the corresponding solder regions 53A. Package component 52A may be electrically connected to package component 52B, with electrical ground or power supply voltage Vdd being carried by reinforcing patch 44A. Package component 52A may also be signally connected to package component 52B, with signals being transferred through reinforcing patch 44A. Similar to the embodiments in FIG. 14, vias 46 may be, or may not be, formed directly underlying reinforcing patch 44A to connect to reinforcing patch 37.

Figure 15B:
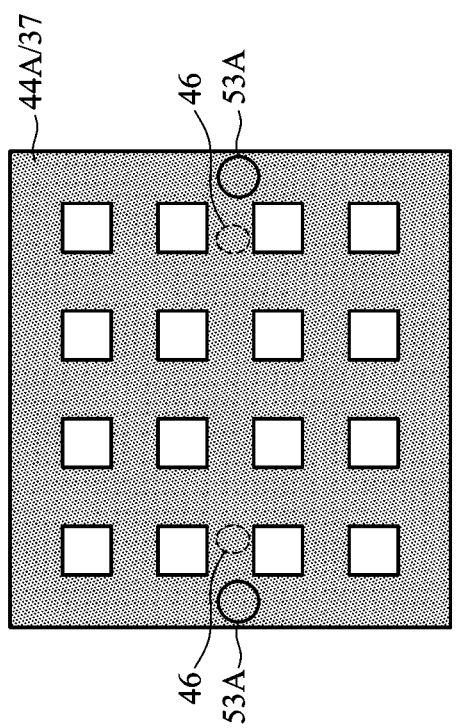

FIG. 15B illustrates a plane view of reinforcing patch 44A that has electrical function. The illustrated reinforcing patch 44A uses the pattern shown in FIG. 16E as an example, while the reinforcing patch having other patterns may be used. Solder regions 53A are formed connecting to the opposing ends of the reinforcing patch 44A. Vias 46, which may or may not be formed, are also shown. It is appreciated that there may be a plurality of vias 46 spread throughout patch 44A, although two are shown. The underlying reinforcing patch 37 (if formed and connected to reinforcing patch 44A) may have a same shape as, or a different shape than, reinforcing patch 44A.

Figure 22:
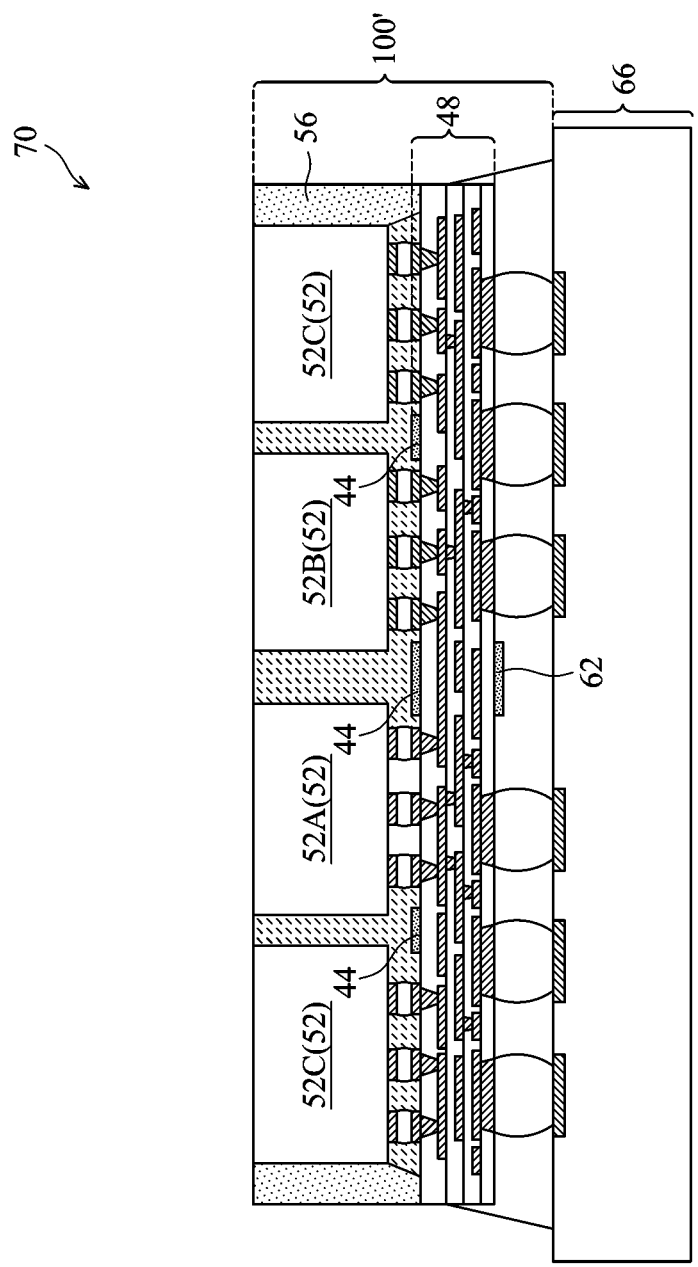
FIG. 22 illustrates a cross-sectional view of a package having a plurality of package components and the corresponding reinforcing patches in accordance with some embodiments.

FIG. 15A also illustrates reinforcing patches 44C distributed in locations other than close to the peripheral regions of package components 52. Although not shown, similar reinforcing patches 44C may be formed in other layers, for example, formed in the same formation process as the illustrated reinforcing patches 27, 33, and 37. Reinforcing patches 44C may be formed wherever enough space may be provided for its formation, so that they have enough size to perform the reinforcing function. Some of reinforcing patches 44C may be fully overlapped by package components 52A and/or 52B as shown in FIG. 15A, while some other reinforcing patches may be fully offset from package components 52A and 52B. Although not shown, reinforcing patches 44C may be formed in other packages 70 such as what are shown in FIGS. 14, 20, and 22.

Figure 20:
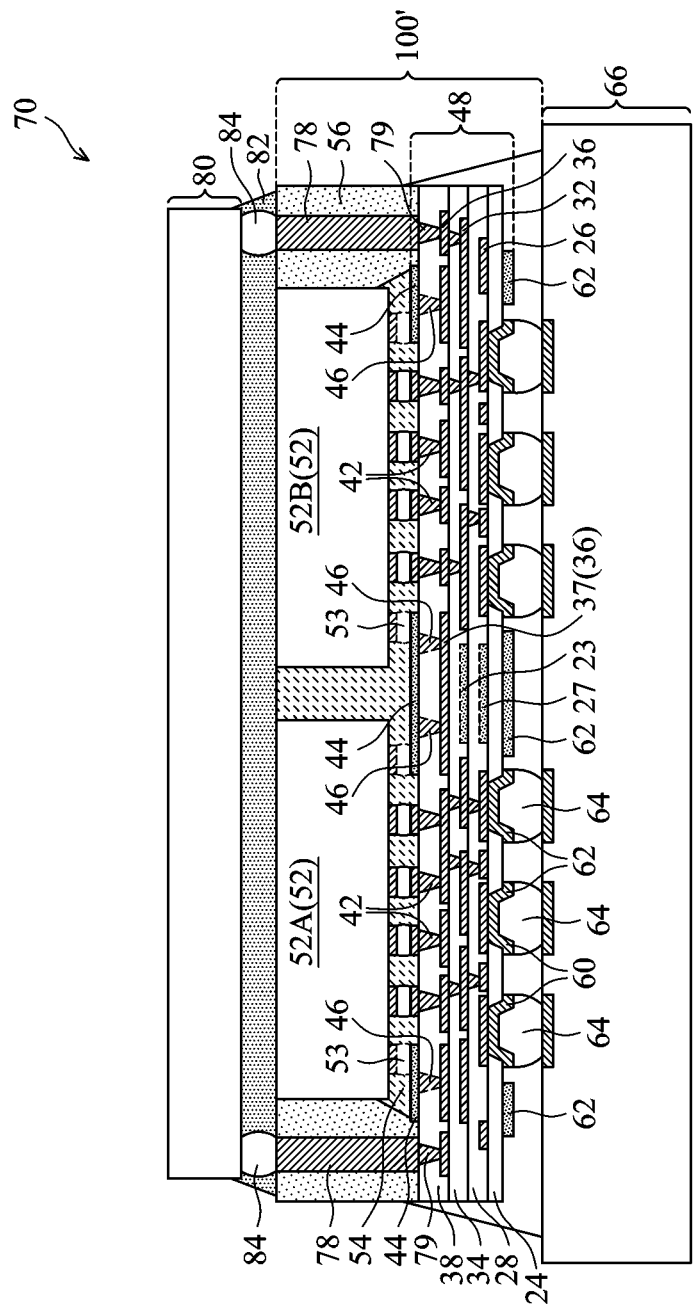
FIGS. 20 and 21 illustrate a cross-sectional view and a plane view, respectively, of a package having through-vias in accordance with some embodiments.
Figure 21:
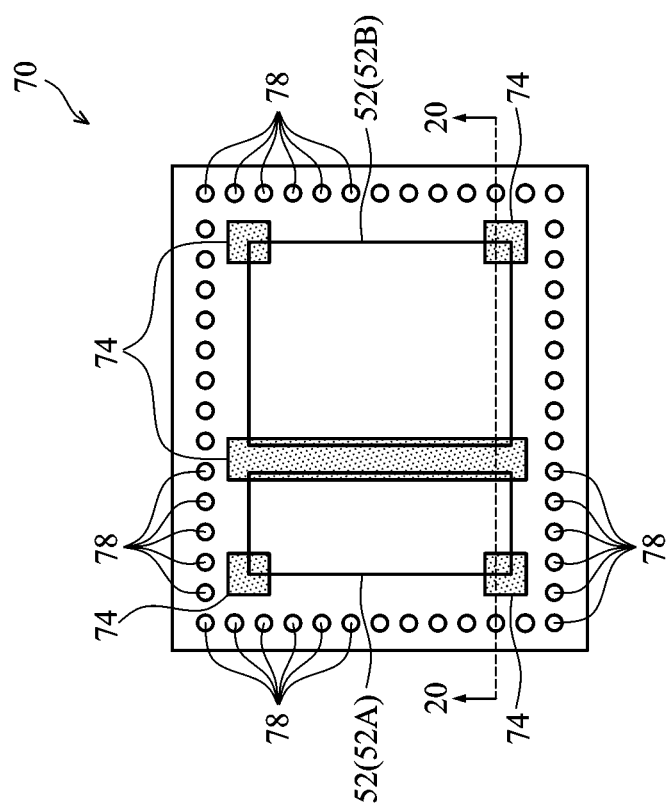

FIGS. 20 and 21 illustrate the cross-sectional view and the top view, respectively, of package 70 in accordance with some embodiments. These embodiments are similar to the embodiments shown in FIGS. 14 and 15A, except that through-vias 78 are formed in encapsulant 56, and are used to electrically connect redistribution structure 48 to package 80. In accordance with some embodiments of the present disclosure, the formation of through-vias 78 comprises forming openings in dielectric layer 38 to expose some metal pads in RDLs 36, forming a metal seed layer extending into the opening, forming a plating mask such as a photo resist over redistribution structure 48, patterning the plating mask to form additional openings, and plating through-vias 78 in the additional openings. Vias 79 are formed in dielectric layer 38 to connect through-vias 78 to RDLs 36. In accordance with some embodiments, to reduce the manufacturing cost, the via openings for vias 79 may be formed simultaneously as the via openings of UBMs 42. The metal seed layer for forming vias 79 and through-vias 78 may thus be the same metal seed layer for forming UBMs 42 and reinforcing patches 44. Alternatively stated, through-vias 78 and vias 79 share the same via opening formation process and the same metal seed layer formation process as UBMs 42, but have different plating masks and different plating processes than UBMs 42. Package components 52 may be bonded to redistribution structure 48 after the formation of through-vias 78 in accordance with some embodiments.

After the encapsulation of through-vias 78 and package components 52 in encapsulant 56, package 80 is bonded to through-vias 78 through solder regions 84. In accordance with some embodiments, package 80 includes memory dies bonded to a package substrate. Underfill 82 may be dispensed to protect solder regions 84. The corresponding reconstructed wafer is then sawed into packages 100'. Package component 66 is bonded with one of packages 100'.

FIG. 21 illustrates an example plane view of package 70 having through-vias 78 in accordance with some embodiments. Through-vias 78 may be aligned to a ring encircling package components 52. Reinforcing patches 74 are also illustrated in accordance with some embodiments. It is appreciated that the illustrated reinforcing patches 74 and package components 52 are examples, and other layouts such as what are shown in FIGS. 18 and 19 may also be adopted.

FIG. 22 illustrates the cross-sectional view of package 70 in accordance with some embodiments. These embodiments a similar to the embodiments shown in FIGS. 14 and 15A, except that besides package components 52A and 52B, there may be a plurality of package components 52C. In accordance with some embodiments, package components 52A and 52B are logic dies, and package components 52C may be memory dies, memory die stacks such HBMs, memory packages, or the like. FIG. 22 may be obtained from the reference cross-sectional 22-22 as shown in FIG. 19.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming reinforcing patches in some locations of packages where stresses are high, the reinforcing patches may provide extra mechanical support to the package. The reinforcing patches may be formed sharing the common processes as the formation process of some RDLs, and hence no extra cost is incurred.

In accordance with some embodiments of the present disclosure, a method includes forming a redistribution structure comprising forming a plurality of dielectric layers over a carrier; forming a plurality of redistribution lines extending into the plurality of dielectric layers; and forming a reinforcing patch over the carrier; bonding a first package component to the redistribution structure, wherein the first package component comprises a peripheral region overlapping a portion of the reinforcing patch; and de-bonding the redistribution structure and the first package component from the carrier. In accordance with an embodiment, the method further includes dispensing an underfill between the first package component and the redistribution structure, wherein the underfill contacts the reinforcing patch. In accordance with an embodiment, the method further includes, after the de-bonding, forming an additional reinforcing patch, wherein the reinforcing patch and the additional reinforcing patch are on opposing sides of the plurality of dielectric layers. In accordance with an embodiment, the forming the redistribution structure further comprises forming a plurality of under-bump metallurgies extending into one of the plurality of dielectric layers, wherein the reinforcing patch and the plurality of under-bump metallurgies are formed in a common process, and wherein the first package component is bonded to the plurality of under-bump metallurgies. In accordance with an embodiment, the forming the reinforcing patch comprises plating. In accordance with an embodiment, after the de-bonding, the reinforcing patch is fully enclosed in dielectric materials. In accordance with an embodiment, the method further includes bonding a second package component to the redistribution structure, wherein the reinforcing patch comprises a first portion overlapped by the first package component; a second portion overlapped by the second package component; and a third portion joining the first portion to the second portion. In accordance with an embodiment, the reinforcing patch has a mesh pattern.

In accordance with some embodiments of the present disclosure, a package includes a redistribution structure comprising a plurality of dielectric layers; a plurality of redistribution lines extending into the plurality of dielectric layers; and a reinforcing patch overlapping the plurality of dielectric layers, wherein the reinforcing patch comprises a metallic material; a first package component over and bonded to the redistribution structure; and an underfill between the redistribution structure and the first package component, wherein the underfill contacts the reinforcing patch. In accordance with an embodiment, the reinforcing patch is fully enclosed in dielectric materials. In accordance with an embodiment, the reinforcing patch has a width greater than about 500 µm. In accordance with an embodiment, the reinforcing patch is overlapped by an edge portion of the first package component, with an overlapping width being greater than about 200 µm. In accordance with an embodiment, the reinforcing patch is electrically floating. In accordance with an embodiment, the reinforcing patch is electrically connected to the first package component, and the reinforcing patch has a mesh structure. In accordance with an embodiment, the reinforcing patch forms a ring proximal four edges of the first package component.

In accordance with some embodiments of the present disclosure, a package includes a redistribution structure comprising a plurality of dielectric layers; a plurality of redistribution lines extending into the plurality of dielectric layers; and a reinforcing patch contacting one of the plurality of dielectric layers, wherein the reinforcing patch is electrically floating; and a package component bonded to the redistribution structure, wherein the reinforcing patch comprises a first portion overlapped by a corner portion of the package component. In accordance with an embodiment, the reinforcing patch further comprises a second portion extending beyond the package component. In accordance with an embodiment, the first portion of the reinforcing patch has a width greater than about 200 µm. In accordance with an embodiment, the reinforcing patch forms a ring comprising an inner portion overlapped by the package component; and an outer portion extending beyond edges of the package component, wherein both of the inner portion and the outer portion have ring shapes. In accordance with an embodiment, the structure further includes an underfill between the redistribution structure and the package component, wherein the underfill contacts the reinforcing patch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a redistribution structure comprising:
        a plurality of dielectric layers;
        a plurality of redistribution lines extending into the plurality of dielectric layers; and
        a reinforcing patch overlapping the plurality of dielectric layers, wherein the reinforcing patch comprises a metallic material;
    a first package component over and bonded to the redistribution structure, wherein a portion of the reinforcing patch is overlapped by the first package component; and
    an underfill between the redistribution structure and the first package component, wherein the underfill contacts the reinforcing patch.

2. The package of claim 1, wherein the reinforcing patch is fully enclosed in dielectric materials.

3. The package of claim 1, wherein the reinforcing patch has a width greater than about 500 µm.

4. The package of claim 1, wherein the reinforcing patch is overlapped by an edge portion of the first package component, with an overlapping width being greater than about 200 µm.

5. The package of claim 1, wherein the reinforcing patch is electrically floating.

6. The package of claim 1, wherein the reinforcing patch is electrically connected to the first package component, and the reinforcing patch has a mesh structure.

7. The package of claim 1, wherein the reinforcing patch forms a ring proximal four edges of the first package component.

8. A package comprising:
a redistribution structure comprising:
a plurality of dielectric layers;
a plurality of redistribution lines extending into the plurality of dielectric layers; and
a reinforcing patch contacting one of the plurality of dielectric layers, wherein the reinforcing patch is electrically floating; and
a package component bonded to the redistribution structure, wherein the reinforcing patch comprises a first portion overlapped by a corner portion of the package component.

9. The package of claim 8, wherein the reinforcing patch further comprises a second portion extending beyond the package component.

10. The package of claim 8, wherein the first portion of the reinforcing patch has a width greater than about 200 μm.

11. The package of claim 8, wherein the reinforcing patch forms a ring comprising:
an inner portion overlapped by the package component; and
an outer portion extending beyond edges of the package component, wherein both of the inner portion and the outer portion have ring shapes.

12. The package of claim 8 further comprising:
an underfill between the redistribution structure and the package component, wherein the underfill contacts the reinforcing patch.

13. A package comprising:
a redistribution structure comprising:
a plurality of dielectric layers;
a plurality of redistribution lines extending into the plurality of dielectric layers; and
a reinforcing patch in a same layer as one of the plurality of redistribution lines, wherein the reinforcing patch is electrically floating; and
a first package component over the redistribution structure, wherein the first package component comprises a peripheral region overlapping a first portion of the reinforcing patch, and the reinforcing patch further comprises a second portion vertically offset from the first package component.

14. The package of claim 13 further comprising an underfill between the first package component and the redistribution structure, wherein the underfill contacts the reinforcing patch.

15. The package of claim 13 further comprising an additional reinforcing patch, wherein the reinforcing patch and the additional reinforcing patch are on opposing sides of the plurality of dielectric layers.

16. The package of claim 13, wherein the redistribution structure further comprises:
a plurality of under-bump metallurgies extending into one of the plurality of dielectric layers, wherein the first package component is bonded to the plurality of under-bump metallurgies.

17. The package of claim 13, wherein the reinforcing patch comprises a same conductive material as the one of the plurality of redistribution lines.

18. The package of claim 13, wherein the reinforcing patch is fully enclosed in dielectric materials.

19. The package of claim 13 further comprising a second package component bonded to the redistribution structure, wherein the reinforcing patch comprises:
a third portion overlapped by the second package component, wherein the second portion joins the first portion to the second portion.

20. The package of claim 13, wherein the reinforcing patch has a mesh pattern.

* * * * *